(12) United States Patent
Hapke et al.

(10) Patent No.: US 6,789,219 B2
(45) Date of Patent: Sep. 7, 2004

(54) ARRANGEMENT AND METHOD OF TESTING AN INTEGRATED CIRCUIT

(75) Inventors: Friedrich Hapke, Winsen/Luhe (DE); Ruediger Solbach, Hamburg (DE); Andreas Glowatz, Heidenau (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 495 days.

(21) Appl. No.: 09/923,614

(22) Filed: Aug. 7, 2001

(65) Prior Publication Data

US 2002/0069385 A1 Jun. 6, 2002

(30) Foreign Application Priority Data

Aug. 10, 2000 (DE) .......................................... 100 39 001

(51) Int. Cl.[7] ....................... G01R 31/3187; G06F 17/50
(52) U.S. Cl. ....................... 714/732; 714/736; 714/744; 716/6
(58) Field of Search .............................. 714/732, 736, 714/744; 716/4–6

(56) References Cited

U.S. PATENT DOCUMENTS

| | | | | |
|---|---|---|---|---|
| 4,791,356 | A | * 12/1988 | Warren et al. | 324/73.1 |
| 5,349,587 | A | 9/1994 | Nadeau-Dostie et al. | 371/22.3 |
| 5,526,286 | A | * 6/1996 | Sauerwein et al. | 702/79 |
| 5,630,102 | A | * 5/1997 | Johnson et al. | 703/28 |
| 5,689,689 | A | * 11/1997 | Meyers et al. | 709/400 |
| 6,029,261 | A | * 2/2000 | Hartmann | 714/724 |
| 6,219,811 | B1 | * 4/2001 | Gruetzner et al. | 714/726 |

OTHER PUBLICATIONS

Kopeć, Michal., Circular built–in self–test for controllers with many internal clocks, Archives of Control Sciences (Poland), vol.6(42), No.3–4, p.261–72, Aug.–Dec. 1997. , Published: Warsaw Univ. Technol.*

Ciota, Z.; Napieralski, A.; Noullet, J.L.; Analogue Realisation of Integrated FIR Filters; IEE Proceedings Circuits, Devices and Systems, vol.: 143, Issue: 5 , Oct. 1996 pp.: 274–281.*

* cited by examiner

Primary Examiner—R. Stephen Dildine
(74) Attorney, Agent, or Firm—Michael J. Lure

(57) ABSTRACT

In an arrangement for testing an integrated circuit comprising at least two circuit sections (1, 2) which in normal operation operate with at least two different clock signals, a minimal number of test runs for testing the integrated circuit is required because the integrated circuit to be tested is formed in such a way that each clock signal can be individually switched on and off during a test by test software provided in the arrangement, a software model of the circuit to be tested is provided in the arrangement, which software model comprises an X generator (38, 40) for those circuit components (33, 35) whose mode of operation is influenced by a plurality of clock signals and their skew behavior, which X generator is activated and supplies an X signal when more than one clock signal influencing the mode of operation of the circuit components (33, 35) during testing is activated, while, during testing, the test software initially activates all clock signals and evaluates test results for those circuit components (3, 5) for which no X signal appears in the software model (33, 35), and because for those circuit components (3, 5) for which an X signal appeared in the software model (33, 35) during testing with all clock signals, the test software performs a plurality of test runs in which each time only one or more of the clock signals influencing the mode of operation of the circuit component (3, 5) is/are activated and evaluates only those tests of the circuit components (3, 5) of the circuit for which no X signal appears in the software model (33, 35).

4 Claims, 2 Drawing Sheets

ARRANGEMENT AND METHOD OF TESTING AN INTEGRATED CIRCUIT

Figure 1:
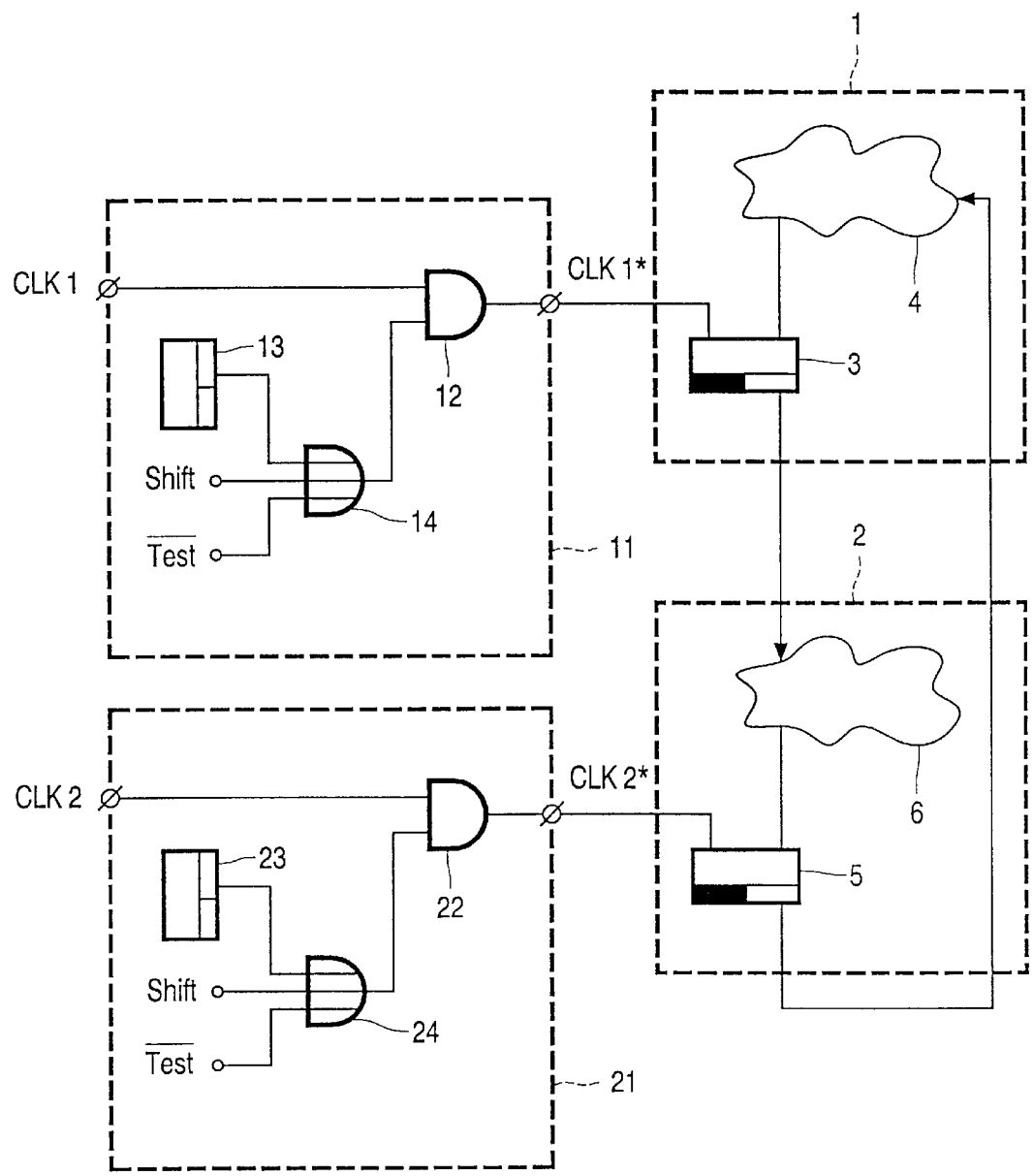

The invention relates to an arrangement and a method of testing an integrated circuit comprising at least two circuit sections which in normal operation operate with at least two different clock signals.

In such integrated circuits, there is the fundamental problem that temporal fluctuations affecting the mode of operation of the circuit may occur between the different clock signals. Such phase fluctuations or phase shifts may have the result, for example, that a given flip-flop in the circuit, which is clocked with a first clock, just takes over or does not take over a signal coming from a second flip-flop clocked with a second clock. These phase fluctuations or shifts which may cause such problems are known as skew in literature. To recognize such an erroneous behavior, each integrated circuit is tested after its manufacture, particularly taking the problem of skew into account. Since individual elements of the sometimes very complex integrated circuit cannot be accessed during testing, the skew problem may lead to false test results or results that cannot be evaluated. In particular, it is impossible to determine whether individual components which are critical as regards skew behavior operate flawlessly.

U.S. Pat. No. 5,349,587 discloses a test arrangement attempting to avoid this problem by activating each time only one clock signal during testing of integrated circuits operating with a plurality of clock signals. In this way, all test signals are activated one after the other so that all circuit components can be tested but the test effort increases enormously because a corresponding large number of test vectors is to be provided. This solution is therefore inappropriate for testing series manufactured integrated circuits due to the effort and the long time required for the tests.

It is an object of the invention to provide an arrangement and a method of testing integrated circuits of the type described in the opening paragraph, with which circuits operating with a plurality of clock signals can also be tested in a minimally short time and with a minimal number of test vectors.

According to the invention, this object is solved in that the integrated circuit to be tested is formed in such a way that each clock signal can be individually switched on and off during a test by test software provided in the arrangement, in that a software model of the circuit to be tested is provided in the arrangement, which software model comprises an X generator for those circuit components whose mode of operation is influenced by a plurality of clock signals and their skew behavior, which X generator is activated and supplies an X signal when more than one clock signal influencing the mode of operation of the circuit components during testing is activated, in that, during testing, the test software initially activates all clock signals and evaluates test results for those circuit components for which no X signal appears in the software model, and in that for those circuit components for which an X signal appeared in the software model during testing with all clock signals, the test software performs a plurality of test runs in which each time only one or more of the clock signals influencing the mode of operation of the circuit component is/are activated and evaluates only those tests of the circuit components of the circuit for which no X signal appears in the software model.

For the test arrangement according to the invention, the following fundamental mode of operation is used. On the one hand, there is a real integrated circuit which can be tested by means of hardware provided for this purpose in the arrangement, in which exterior signals are derived from the circuit and checked on whether they correspond to the nominal behavior of the circuit. In parallel, there is a software model for the circuit to be tested, from which the nominal behavior is known, on the one hand, and is used, on the other hand, to determine in a way to be described below which circuit components of the circuit, possibly with a plurality of simultaneously activated clock signals, can be tested.

It is assumed that the arrangement according to the invention for testing an integrated circuit is formed in such a way that each clock signal used or appearing in the integrated circuit can be individually switched on and off during testing by means of external test software in the arrangement. It should thus be possible to switch the individual clock signals on or off, as required, by means of the test software, while it should also be possible to activate possibly more clock signals simultaneously.

In known manner, the arrangement according to the invention for testing integrated circuits comprises a software model of the circuit which is provided in the integrated circuit and is to be tested. In the arrangement according to the invention, the software model is, however, formed in such a way that an X generator is provided for those circuit components whose mode of operation is influenced by a plurality of clock signals and their skew behavior. Thus, those circuit components are concerned that qualify for the above-described skew problem. This X generator is formed in the software model in such a way that it always supplies a so-called X signal when, during testing, more than one clock signal influencing the mode of operation of the relevant circuit component is activated. In other words, the X generator always supplies the X signal when the above-described skew problem might be relevant for the circuit components concerned. This is always the case when the behavior of the circuit components is dependent on the exact phase relations of the clock signals involved.

Fundamentally, an X signal appearing in the software model always signalizes a skew problem in the circuit components located in those areas where the signal appears.

During testing, the test software will initially activate all clock signals, because all components of the integrated circuit can be tested most rapidly in this way. For those circuit components for which the skew problem is to be feared, however, the assigned X generator is activated in the software model. Consequently, an X signal appears in the software model during the first test run with all activated clock signals for some circuit components. This signalizes to the test software that the test run with all activated clock signals for these circuit components does not yield any valid results. In the first test run, in which all clock signals are activated, the test results of the real integrated circuit are thus only evaluated for those circuit components for which no X signal is obtained in the software model.

For those circuit components for which an X signal is obtained in the software model, further test runs are subsequently performed, in which test runs the test software attempts, by deactivating further clock signals, to obtain effective test results for all circuit components, which results, as stated, are only present when no X signal appears for the relevant circuit components. The operation may be performed, for example, in such a way that, starting from the activation of all clock signals, clock signals are switched off one after the other in the first test run until no X signal appears any longer for the relevant circuit component. In an extreme case, this may lead to only one clock signal that may be activated until no X signal appears any longer.

It is achieved by means of the method according to the invention that valid test results are obtained for a relatively high number of circuit components in an integrated circuit already in the first test run in which all clock signals are activated. Only a relatively small number of circuits, in which invalid results are obtained in this test run, requires further test runs with clock signals deactivated one after the other. As compared with the prior art, the number of test runs is thereby considerably reduced.

An embodiment of the test arrangement according to the invention is characterized by the characterizing features as defined in claim 2. This hardware arrangement requires a relatively small number of additional circuit components to be used for testing in the integrated circuit. The circuit components provided can be realized at low cost in integrated circuits.

The above-described mode of operating the test runs can be advantageously performed for achieving a minimal number of test runs as defined in claim 3.

The object is further solved by the characteristic features as defined in claim 4 for a testing method.

These and other aspects of the invention are apparent from and will be elucidated with reference to the embodiments described hereinafter.

Figure 2:
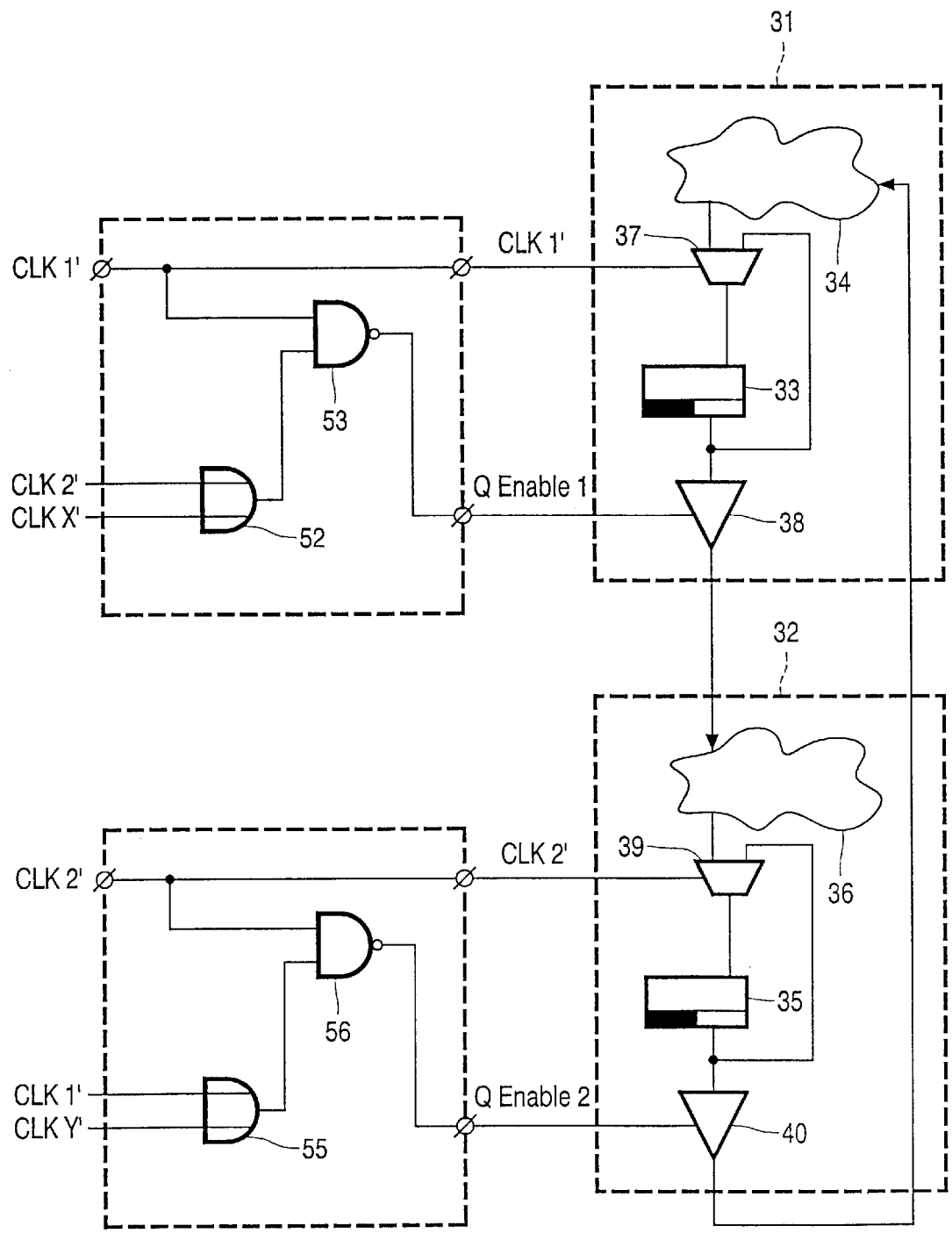

In the drawings:

FIG. 1 shows diagrammatically circuit components of an integrated circuit to be tested, with additional hardware allowing switching of individual clock signals in the circuit, and FIG. 2 shows diagrammatically the test software comprising the circuit components of FIG. 1, X generators as well as a switching logic element for switching the X generators.

The right-hand part in the diagrammatic FIG. 1 shows some sections of an integrated circuit (not shown in detail). For example, a first circuit section 1 and a second circuit section 2 are provided. The first circuit section 1 comprises circuit components 4 which are not further shown and are only indicated diagrammatically. Furthermore, a circuit component 3 is shown which is clocked by means of a first clock signal (CLK 1*).

The circuit section 2 comprises circuit components 6 which are neither further shown and are only indicated diagrammatically. This section, however, also comprises a circuit component 5 which is shown in a detailed form and is clocked by means of a second clock signal CLK 2*.

The circuit components 3 and 5 are those components of the integrated circuit to be tested, whose mode of operation is influenced by a plurality of clock signals and their skew behavior. In this example, it is assumed that the exact mutual phase behavior of both clock signals CLK 1* and CLK 2* influences the behavior of the circuit components 3 and 5. For example, the take-over of data from the circuit component 3 to the circuit component 5 may be dependent on the exact mutual phase behavior of both clock signals CLK 1* and CLK 2*.

During testing, this has the result that, dependent on the skew behavior, different results may be obtained after a simultaneous activation of both clock signals CLK 1* and CLK 2*, because data with a given edge of the clock CLK 2* may or may not be taken over in the circuit component 5. It is therefore impossible to subject the behavior of the circuit to a reliable test when both clock signals are activated. As will be described in further detail below, a special way of using the test software and a special software model of the circuit is provided for this purpose in the arrangement according to the invention.

However, the corresponding way in which the test software is used presupposes in the hardware circuit indicated in FIG. 1 that the individual clock signals are switchable in the integrated circuit. For this purpose, a first switching logic element 11 is provided which allows switching of an original first clock signal CLK 1, as required, and forming the first clock signal CLK 1* therefrom.

The first switching logic element 11 comprises an AND gate receiving the original clock signal CLK 1 and also receiving an output signal from an OR gate 14 at a second input. The OR gate 14 has three inputs receiving an output signal from a first flip-flop 13, a shift signal denoted by Shift in the Figure, and an inverted test signal, denoted by Test in the Figure.

The shift signal Shift is a signal which is activated during testing as long as new data are shifted into or read from the integrated circuit. The inverted test signal Test has a low amplitude when a test run takes place.

During a test run; the signal Test has a high amplitude 1. Furthermore the shift signal Shift has a low amplitude 0 when no data are shifted into or out of the integrated circuit. During these periods of operation, the output signal of the OR gate depends during testing on the state of the flip-flop 13. The state of the flip-flop 13 in turn depends on whether a 0 or a 1 was previously shifted into the flip-flop by the test software in a way not further shown in the Figure. This 0 or 1 determines via the OR gate 14, whose output signal is applied to the second input of the AND gate 12, whether the original clock signal CLK 1 reaches the output of the AND gate or not. As a result, the clock signal CLK 1* may be switched on or off in this way, dependent on whether a 0 or a 1 was loaded into the flip-flop 13 by the test software.

In a corresponding manner, an AND gate 22, an OR gate 24 and a second flip-flop 23 are provided in the second switching logic element 21. They operate in a corresponding way as in the first switching logic element 11 and thus allow the second clock signal CLK 2* to be switched on or off under the control of the test software.

There may of course be more than two clock signals in an integrated circuit. In such a case, a switching logic element is provided for each clock signal which may be formed similarly as the switching logic elements 11 and 21 as shown in FIG. 1. A different implementation of the switching logic elements is of course also possible but it should be ensured that each clock signal of the integrated circuit can be individually switched on and off by means of test software data.

When testing an integrated circuit, only sections of which are shown in FIG. 1, a software model is provided parallel to the measurements or the tests of the actual hardware of the integrated circuit, which software model simulates the behavior of the circuit and thus allows a nominal behavior of this circuit.

Sections of such a software model are indicated in the right-hand part of FIG. 2. Exactly those sections are concerned which should simulate those sections of the integrated circuit that are shown in FIG. 1. Thus, a circuit section 31 of the software model according to FIG. 2 should simulate a circuit section 1 of the hardware of FIG. 1. The same applies to a second section 32 of the software model in FIG. 2, which should simulate a corresponding section of the hardware in FIG. 2.

The section 31 shows circuit components 34 which are not further shown. It also comprises a circuit component 33 which represents the circuit component 3 of the actual hardware of FIG. 1 as a model. Section 32 of the software model further includes a circuit component 35 which represents the real circuit component 5 of the circuit of FIG. 1 as a model.

As already described hereinbefore, it will hereinafter be assumed that the two circuit components 3 and 5 in the integrated circuit shown in FIG. 1 are critical as regards their skew behavior. When implementing the software model, it is taken into account that these two circuit components 3 and 5 and thus the corresponding circuit components 33 and 35 in the software model cannot or should not be tested while simultaneously activating the clock signals CLK 1* and CLK 2*. For this reason, so-called X generators 38 and 40 are provided which, in the software model, are preceded by the relevant circuit components 33 and 35 and only supply an X signal as an output signal when they are activated. The activation of the X generators 38 and 40 will hereinafter be described in further detail.

In the software model according to FIG. 2, the first circuit component 33 is clocked by means of a clock signal CLK 1' which corresponds to the clock signal CLK 1* in the real hardware.

The clock signal CLK 1' is applied to a switching input of a multiplexer 37, the two other inputs of which receive the signal from the circuit components 34 and a feedback output signal from the circuit component 33. The multiplexer 37 is used to retain the state of the circuit component 33 in a test run, which component may be, for example, a flip-flop, in order that tests can be subsequently performed in possible further runs in other components of the circuit while retaining this state of the circuit component 33.

In a corresponding manner, a multiplexer 39 is assigned to the circuit component 35, which multiplexer receives a clock signal CLK 2' at its switching input, which clock signal corresponds to the clock signal CLK 2* in the real circuit of FIG. 1.

As will be further explained, it is decisive for the test run when the X generators 38 and 40 are activated via the enable signals Enable 1 and Enable 2 and when they are not activated.

It is assumed that both for the circuit component 3 of the circuit of FIG. 1 and for the circuit component 5, no other clock except the assigned clock CLK 1* and CLK 2*, respectively, may be activated so as to allow faultless measurement of the behavior of the relevant circuit component 3 or 5 without the above-described skew problem. In other words, no other clock must be switched on.

The software model of FIG. 2 is implemented in a corresponding manner. An inverting AND gate 53 is provided which combines the clock signal CLK 1' and, via an OR gate, the two clock signals CLK 2' and CLK x'. The circuit component 39 can only be measured when the clock CLK 1' or, in the real circuit, the clock signal CLK 1* is activated. The software logic circuit of FIG. 2 is, however, arranged in such a manner that the X generator 38 is already activated when one of the two other clock signals CLK 2' or CLK x' is available. In fact, when there is a clock CLK 1', a logic 0 will appear at the output of the AND gate 53 which activates the X generator 38.

This similarly applies to the circuit component 35 whose assigned X generator 40 is activated when one of the other clocks CLK 1' or CLK y' is active.

In other words, the circuit components 33 and 35 can only be measured without any influence of the skew problem when the respective assigned clock CLK 1' or CLK 2' is exclusively activated.

This implementation of the software model is performed in dependence upon the behavior of the real circuit, i.e. for each circuit component of the real circuit it should be considered which skew problems may occur and which clock signals may be maximally activated during testing. In the embodiment, the clock signals CLK 2' and CLK x' in the case of the circuit component 33 and the clock signals CLK 1' and CLK y' in the case of the circuit component 35 may not be activated during testing. When a test is nevertheless performed when one of these clock signals is activated, the respective assigned X generator 38 or 40 generates a corresponding X signal.

This X signal signalizes an invalid measuring result or a result affected by the skew problem to test software (not shown).

Consequently, the test software can observe the software model in parallel during testing of the real circuit and determine continuously which test results are valid. These are the test results for which no X signal appears in the software model.

The testing procedure may be, for example, as follows.

A circuit is initially tested while activating all clock signals. The software model is observed and in this first run the test software only evaluates the test results for those components for which no X signal appears in the software model. In subsequent test runs, those components for which an X signal appeared in the software model during the first run should be measured once again. The clocks may then be individually deactivated one after the other until no X signal appears any longer for each component. This procedure may be individually performed for the different components. Thus, for each component, one of the clock signals influencing the mode of operation of this component may be employed until no X signal appears any longer for the component.

Overall, a clear reduction of the test runs is achieved because valid test results can be achieved for many components already in the first run in which all clock signals are activated. Also for those components which are subsequently measured once again while deactivating individual clock signals, a reduction of the number of test runs is achieved in comparison with the state of the art, because it is often not necessary to generate all clock signals; in an individual case it may be, for example, sufficient to deactivate one of three clock signals so as to achieve valid measuring results. As compared with the state of the art, a clear reduction of the number of test runs is achieved. Simultaneously, the required hardware on the integrated circuit to be measured is very small because it must be ensured in this case that the individual clock signals can be simply switched on and off.

What is claimed is:

1. An arrangement for testing an integrated circuit comprising at least two circuit sections (1, 2) which in normal operation operate with at least two different clock signals, characterized in that the integrated circuit to be tested is formed in such a way that each clock signal can be individually switched on and off during a test by test software provided in the arrangement, in that a software model of the circuit to be tested is provided in the arrangement, which software model comprises an X generator (38, 40) for those circuit components (33, 35) whose mode of operation is influenced by a plurality of clock signals and their skew behavior, which X generator is activated and supplies an X signal when more than one clock signal influencing the mode of operation of the circuit components (33, 35) during testing is activated, in that, during testing, the test software initially activates all clock signals and evaluates test results for those circuit components (3, 5) for which no X signal appears in the software model (33, 35), and in that for those circuit components (3, 5) for which an X signal appeared in the software model (33, 35) during testing with all clock signals, the test software performs a plurality of test runs in which each time only one or more of the clock signals influencing the mode of operation of the circuit component (3, 5) is/are activated and evaluates only those tests of the circuit components (3, 5) of the circuit for which no X signal appears in the software model (33, 35).

2. An arrangement as claimed in claim 1, characterized in that the circuit to be tested for all circuit components (3, 5) which themselves operate at an assigned clock and whose mode of operation is also influenced by other clock signals, comprises a flip-flop (13, 23) which can be loaded by the test software and whose output signal is applied to an OR gate (14, 24), whose further inputs receive a shift signal which, during a shift operation in which new data are shifted into or out of the circuit component (3, 5) has a high level, as well as an inverted test signal which has a low level during testing, and in that the output signal of the OR gate (14, 24) is applied to an input of an AND gate (12, 22), whose other input receives the assigned clock signal of the relevant circuit component (3, 5) and whose output signal is supplied as a clock to the circuit component (3, 5).

3. An arrangement as claimed in claim 1, characterized in that the test software initially performs test runs for those circuit components (3, 5) for which an X signal appeared in the software model (33, 35) during testing with all clock signals, in which test runs each time only one of the clock signals influencing the mode of operation of the circuit component (3, 5) is deactivated, and in that, if also an X signal should appear in this test for given circuit components (33, 35), the test software reduces the number of deactivated clock signals until no X signal appears any longer in the software model for the circuit components (33, 35) so that the test results of the relevant circuit components (3, 5) can be evaluated.

4. A method of testing an integrated circuit comprising at least two circuit sections (1, 2) which in normal operation operate with at least two different clock signals, characterized in that the integrated circuit to be tested is formed in such a way that each clock signal can be individually switched on and off during a test by test software provided in the arrangement, in that a software model of the circuit to be tested is provided, which software model comprises an X generator (38, 40) for those circuit components (33, 35) whose mode of operation is influenced by a plurality of clock signals and their skew behavior, which X generator is activated and supplies an X signal when more than one clock signal influencing the mode of operation of the circuit components (33, 35) during testing is activated, in that, during testing, the test software initially activates all clock signals and evaluates test results for those circuit components (3, 5) for which no X signal appears in the software model (33, 35), and in that for those circuit components (3, 5) for which an X signal appeared in the software model (33, 35) during testing with all clock signals, the test software performs a plurality of test runs in which each time only one or more of the clock signals influencing the mode of operation of the circuit component (3, 5) is/are activated and evaluates only those tests of the circuit components (3, 5) of the circuit for which no X signal appears in the software model (33, 35).

* * * * *